United States Patent
Okada et al.

(10) Patent No.: US 12,263,537 B2
(45) Date of Patent: Apr. 1, 2025

(54) CONTROL DEVICE FOR LASER ANNEALING APPARATUS AND LASER ANNEALING METHOD

(71) Applicant: SUMITOMO HEAVY INDUSTRIES, LTD., Tokyo (JP)

(72) Inventors: Yasuhiro Okada, Yokosuka (JP); Masafumi Yorozu, Yokosuka (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 185 days.

(21) Appl. No.: 18/067,121

(22) Filed: Dec. 16, 2022

(65) Prior Publication Data

US 2023/0120514 A1 Apr. 20, 2023

Related U.S. Application Data

(63) Continuation of application No. PCT/JP2021/022562, filed on Jun. 14, 2021.

(30) Foreign Application Priority Data

Jun. 18, 2020 (JP) ................... 2020-104999

(51) Int. Cl.
*B29C 71/04* (2006.01)
*B23K 26/0622* (2014.01)
(Continued)

(52) U.S. Cl.
CPC ........ *B23K 26/351* (2015.10); *B23K 26/0622* (2015.10); *B23K 26/0624* (2015.10);
(Continued)

(58) Field of Classification Search
CPC ............ B23K 26/0622; B23K 26/0624; B23K 26/082; B23K 26/083; B23K 26/351;
(Continued)

(56) References Cited

U.S. PATENT DOCUMENTS

2004/0065643 A1 4/2004 Tanaka
2005/0189329 A1 9/2005 Talwar et al.
(Continued)

FOREIGN PATENT DOCUMENTS

JP 5-217833 A 8/1993
JP 2004-146823 A 5/2004
(Continued)

OTHER PUBLICATIONS

Translation of RU 2400907 C1 (published on Sep. 27, 2010).*
(Continued)

*Primary Examiner* — Leo B Tentoni
(74) *Attorney, Agent, or Firm* — WTA Patents

(57) ABSTRACT

A control device for controlling an annealing apparatus that performs laser annealing by causing a laser beam to be incident on a surface of a semiconductor wafer and moving a beam spot of the laser beam on the surface of the semiconductor wafer, the control device making a sweep speed of the beam spot of the laser beam faster than twice a value obtained by dividing a thermal diffusivity of the semiconductor wafer by a thickness of the semiconductor wafer.

5 Claims, 7 Drawing Sheets

(51) Int. Cl.
    *B23K 26/08*     (2014.01)
    *B23K 26/082*     (2014.01)
    *B23K 26/351*     (2014.01)
    *H01L 21/268*     (2006.01)
    *H01L 21/324*     (2006.01)
    *H01S 3/00*     (2006.01)
    *B23K 101/40*     (2006.01)
    *B23K 103/00*     (2006.01)
    *H01L 21/67*     (2006.01)

(52) U.S. Cl.
    CPC .......... *B23K 26/082* (2015.10); *B23K 26/083* (2013.01); *H01L 21/268* (2013.01); *H01S 3/0085* (2013.01); *B23K 2101/40* (2018.08); *B23K 2103/56* (2018.08); *H01L 21/67115* (2013.01)

(58) Field of Classification Search
    CPC .......... B23K 2101/40; B23K 2103/56; B29C 71/04; H01L 21/324; H01L 21/67115; H01S 3/0085
    USPC ............ 264/40.1, 346, 482; 425/135, 174.4; 219/121.6, 121.61, 121.62, 121.78, 219/121.79, 121.8, 121.81, 121.83, 219/121.85; 372/30
    See application file for complete search history.

(56) References Cited

U.S. PATENT DOCUMENTS

| | | |
|---|---|---|
| 2012/0234810 A1 | 9/2012 | Kudo et al. |
| 2015/0017817 A1* | 1/2015 | Hiejima ............ B23K 26/0624 372/30 X |
| 2015/0170918 A1 | 6/2015 | Wakabayashi et al. |
| 2015/0332923 A1 | 11/2015 | Kudo et al. |
| 2017/0221712 A1 | 8/2017 | Kudo et al. |
| 2020/0266105 A1 | 8/2020 | Ikenoue et al. |

FOREIGN PATENT DOCUMENTS

| | | | |
|---|---|---|---|
| JP | 2011-114052 A | 6/2011 | |
| JP | 2011-119297 A | 6/2011 | |
| JP | 2011-187761 A | 9/2011 | |
| JP | 2012-011402 A | 1/2012 | |
| JP | 2013-045955 A | 3/2013 | |
| RU | 2400907 C1 * | 9/2010 | ............... H02K 1/27 |
| WO | WO 2009/039184 A2 | 3/2009 | |
| WO | WO 2019123611 | 6/2019 | |

OTHER PUBLICATIONS

PCT International Search Report for PCT/JP2021/022562 mailed Aug. 10, 2021 by Japanese Patent Office.
European search report of EP Application No. 21826251 Mailed on Nov. 15, 2023.

* cited by examiner

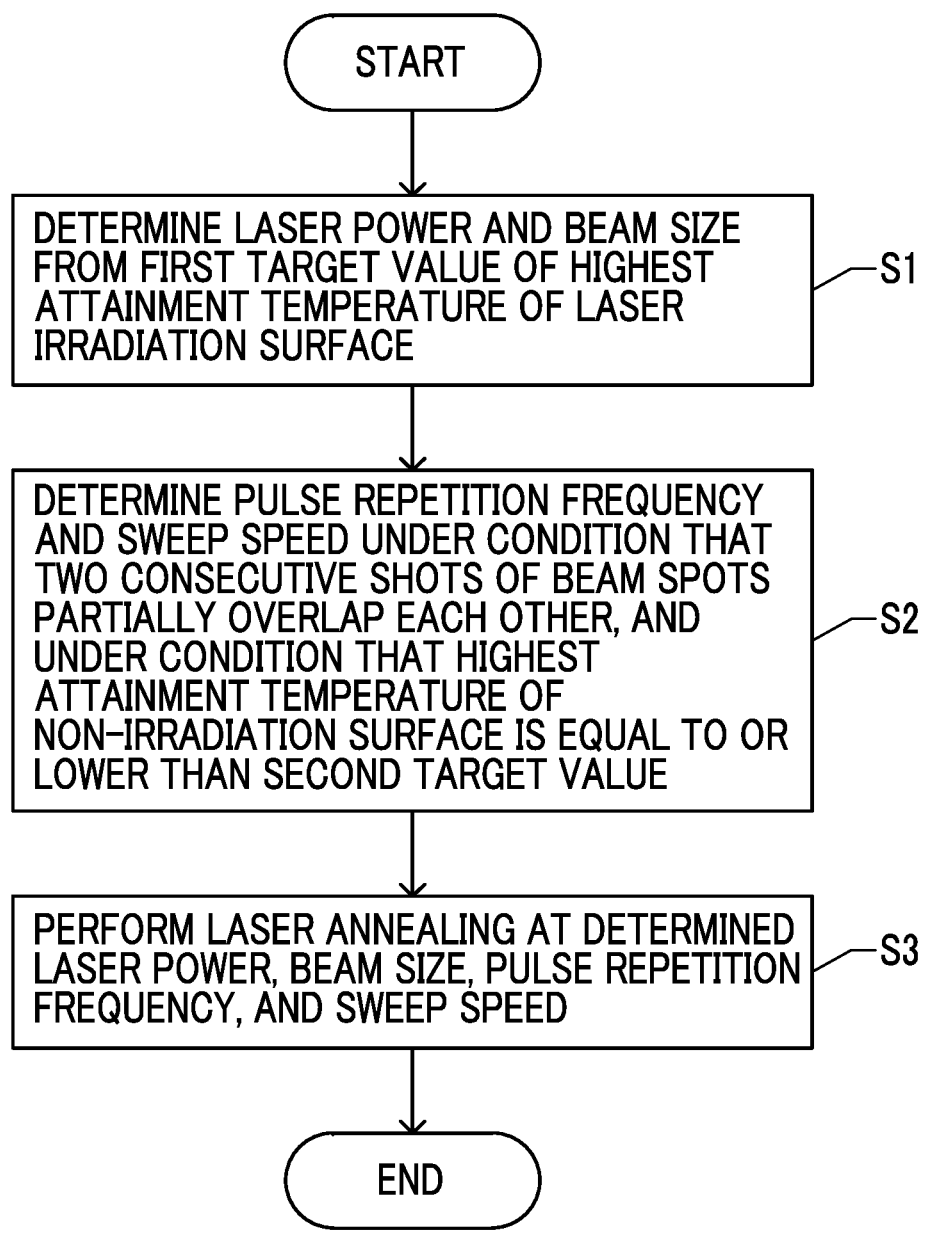

CONTROL DEVICE FOR LASER ANNEALING APPARATUS AND LASER ANNEALING METHOD

CROSS-REFERENCE TO RELATED APPLICATIONS

This is a bypass continuation application of International PCT Patent Application No. PCT/JP2021/022562, filed on Dec. 23, 2021, which claims priority to Japanese Patent Application No. 2020-104999, filed on Jun. 18, 2020, which are incorporated by reference herein in their entirety.

BACKGROUND

Technical Field

A certain embodiment of the present invention relates to a control device for a laser annealing apparatus, and a laser annealing method.

Description of Related Art

In order to perform activation of a dopant doped in a semiconductor wafer such as a silicon wafer, it is necessary to heat (anneal) the semiconductor wafer. A manufacturing process of an insulated gate bipolar transistor (IGBT) or the like includes a process of forming a circuit element on one surface of a semiconductor wafer and then doping the other surface with impurities and perform annealing. When the annealing is performed, a protective tape made of resin is attached to a circuit forming surface. In order to prevent melting of the protective tape, it is desirable to suppress a temperature rise of the circuit forming surface.

In order to sufficiently heat the surface on the side opposite to the circuit forming surface and suppress a temperature rise of the circuit forming surface, laser annealing of irradiating the surface on the side opposite to the circuit forming surface with laser light is used (for example, the related art). As a laser oscillator for annealing, a continuous wave (CW) laser or a pulsed laser such as a Q-switched laser or an excimer laser is used. The related art discloses a laser annealing technique using a laser diode-excited all-solid-state pulsed laser oscillator.

SUMMARY

According to an embodiment of the present invention, there is provided a control device for controlling an annealing apparatus that performs laser annealing by causing a laser beam to be incident on a surface of a semiconductor wafer and moving a beam spot of the laser beam on the surface of the semiconductor wafer, in which the control device makes a sweep speed of the beam spot of the laser beam faster than twice a value obtained by dividing a thermal diffusivity of the semiconductor wafer by a thickness of the semiconductor wafer.

According to another embodiment of the present invention, there is provided a laser annealing method including: determining laser power of a pulsed laser beam that is incident on a laser irradiation surface of a semiconductor wafer and a beam size of the pulsed laser beam on the laser irradiation surface of the semiconductor wafer, from a first target value of a highest attainment temperature of the laser irradiation surface of the semiconductor wafer; determining a pulse repetition frequency and a sweep speed under a condition that two consecutive shots of beam spots partially overlap each other or are in contact with each other when sweeping a beam spot of the pulsed laser beam on the laser irradiation surface of the semiconductor wafer; determining the sweep speed under a condition that a highest attainment temperature of a back surface on a side opposite to the laser irradiation surface of the semiconductor wafer does not exceed a second target value, when determining the sweep speed; and performing laser annealing of the semiconductor wafer at the determined laser power, beam size, pulse repetition frequency, and sweep speed of the beam spot.

BRIEF DESCRIPTION OF THE DRAWINGS

FIG. 6 is a flowchart showing the procedure of a laser annealing method according to the present example.

DETAILED DESCRIPTION

When the semiconductor wafer is thin, it is difficult to heat the surface that is irradiated with laser light (hereinafter referred to as a laser irradiation surface) to a sufficient temperature and suppress a temperature rise of the circuit forming surface (hereinafter referred to as a non-irradiation surface).

It is desirable to provide a control device for a laser annealing apparatus and a laser annealing method in which it is possible to sufficiently raise the temperature of a laser irradiation surface of a semiconductor wafer and suppress a temperature rise of a non-irradiation surface.

By adjusting the sweep speed of the beam spot as described above, it becomes possible to sufficiently raise the temperature of the laser irradiation surface of the semiconductor wafer and suppress a temperature rise of the non-irradiation surface.

Figure 1:
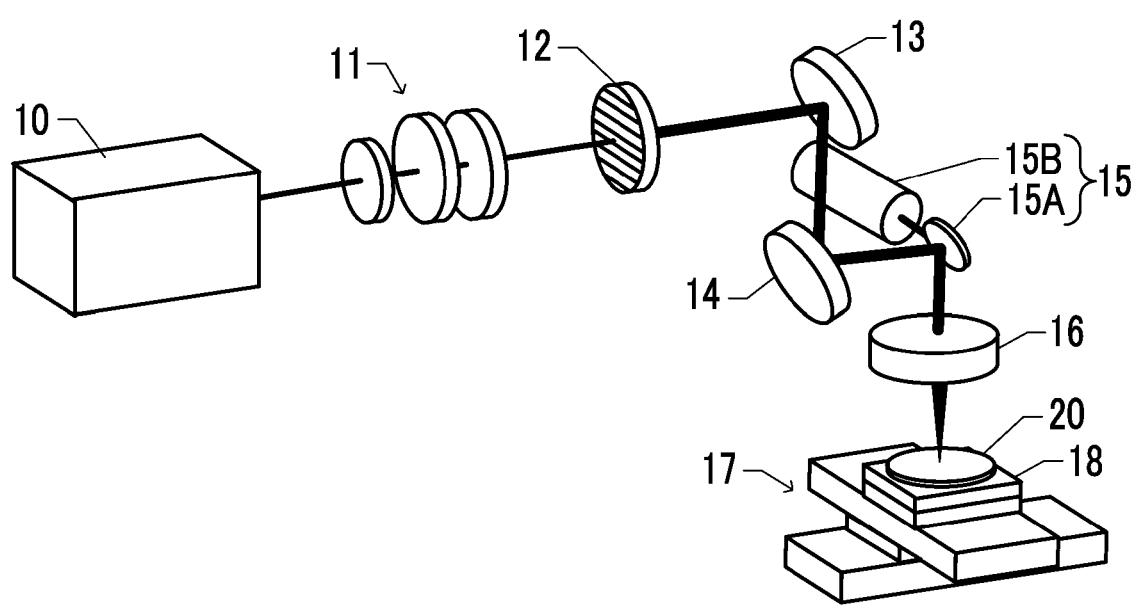
FIG. 1 is a schematic perspective view of a laser annealing apparatus according to an example.

A laser annealing apparatus according to an example will be described with reference to FIGS. 1 to 7B. FIG. 1 is a schematic perspective view of a laser annealing apparatus according to an example. A laser light source 10 outputs a pulsed laser beam. The pulsed laser beam output from the laser light source 10 is incident on a laser irradiation surface of a semiconductor wafer 20, which is an annealing target, via a beam expander 11, a beam shaping optical element 12, folding mirrors 13 and 14, a beam scanner 15, and an fθ lens 16.

The semiconductor wafer 20 is held by a wafer chuck 18 supported by a moving mechanism 17. The moving mechanism 17 moves the wafer chuck 18 in two directions in the horizontal plane. For example, an XY stage is used as the moving mechanism 17.

The beam expander 11 adjusts a beam size (a diameter of a beam cross section) at an incident position of a laser beam on the beam shaping optical element 12. The beam shaping optical element 12 shapes the shape and intensity distribution of a beam spot on the laser irradiation surface of the semiconductor wafer 20. For example, a diffraction optical element is used as the beam shaping optical element 12. The beam scanner 15 includes a galvanometer mirror 15A and a motor 15B. The motor 15B rotates the galvanometer mirror 15A within a certain range in a swing direction to perform scanning with the pulsed laser beam in one-dimensional direction. The fθ lens 16 converges the pulsed laser beam for scanning by the beam scanner 15 onto the laser irradiation surface of the semiconductor wafer 20.

Figure 2:
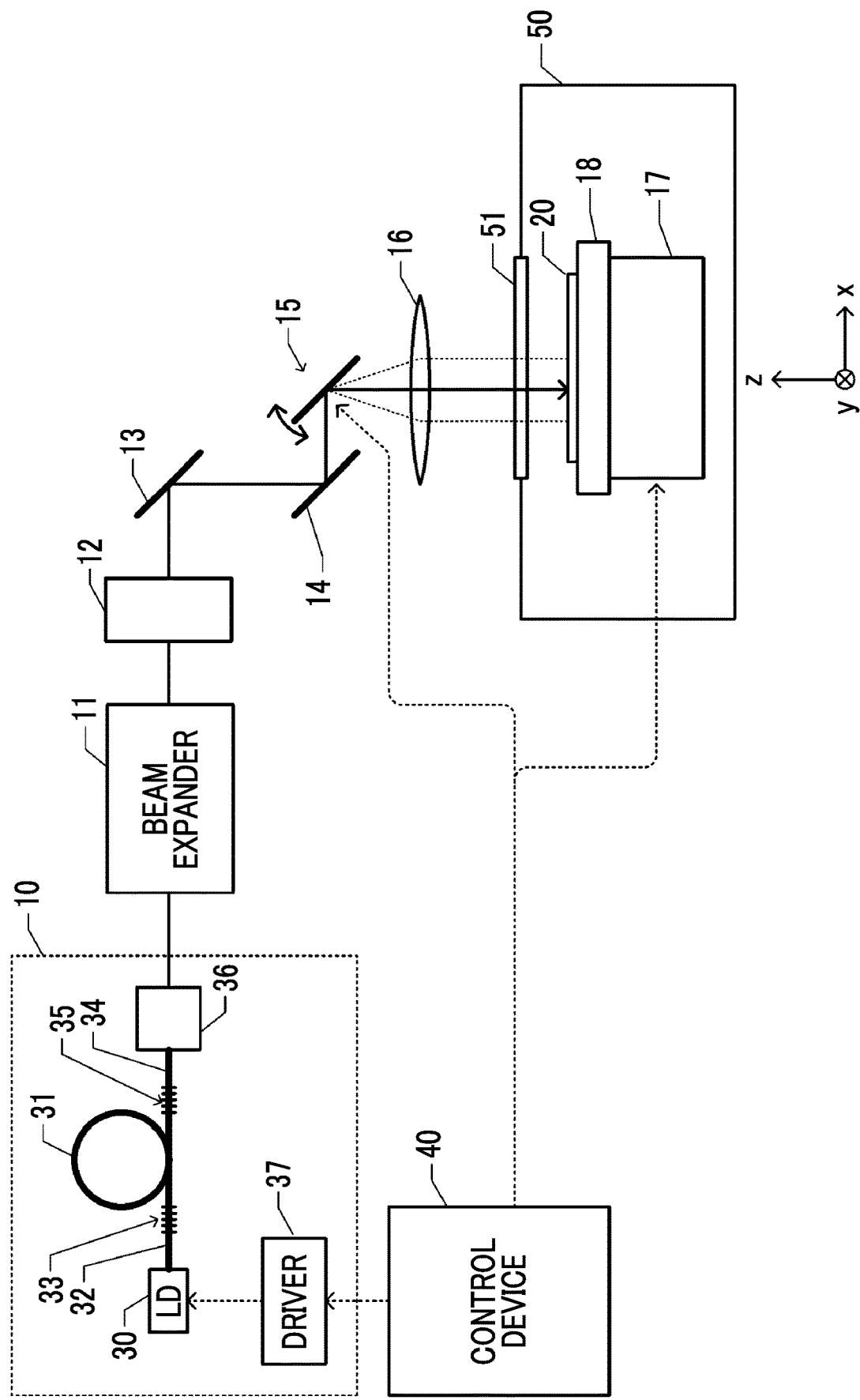
FIG. 2 is a schematic diagram of the laser annealing apparatus according to the present example.

FIG. 2 is a schematic diagram of the laser annealing apparatus according to the present example. The description of the content that overlaps with that in the description of FIG. 1 is omitted.

A fiber laser oscillator is used as the laser light source 10. An input-side optical fiber 32 is connected to one end of a gain fiber 31 doped with a laser active medium, and an output-side optical fiber 34 is connected to the other end of the gain fiber 31. A high reflectance type fiber Bragg grating 33 is formed on the input-side optical fiber 32, and a low reflectance type fiber Bragg grating 35 is formed on the output-side optical fiber 34. An optical resonator is configured by the high reflectance type fiber Bragg grating 33 and the low reflectance type fiber Bragg grating 35.

Excitation light output from a laser diode 30 is introduced into the gain fiber 31 through the input-side optical fiber 32. The laser active medium doped in the gain fiber 31 is excited by the excitation light. Stimulated emission occurs when the laser active medium transitions to a lower energy state, and laser light is generated. The laser light generated by the gain fiber 31 is incident into a wavelength conversion element 36 through the output-side optical fiber 34. The laser beam wavelength-converted by the wavelength conversion element 36 is incident on the semiconductor wafer 20 via the beam expander 11, the beam shaping optical element 12, the folding mirrors 13 and 14, the beam scanner 15, and the fθ lens 16. The gain fiber 31 outputs, for example, infrared region laser light, and the wavelength conversion element 36 converts the infrared region laser light into green wavelength region laser light.

A driver 37 drives the laser diode 30, based on an instruction from a control device 40. The instruction that is received from the control device 40 includes information designating the repetition frequency of a laser pulse that is output from the laser diode 30. The driver 37 causes the laser diode 30 to output excitation laser light at the repetition frequency of the laser pulse instructed by the control device 40. As a result, a pulsed laser beam is output from the laser light source 10 at the instructed repetition frequency.

The moving mechanism 17 and the wafer chuck 18 are disposed in a chamber 50. A laser transmission window 51 is mounted on the wall surface of the chamber 50 above the semiconductor wafer 20 held by the wafer chuck 18. The pulsed laser beam that has passed through the fθ lens 16 passes through the laser transmission window 51 and is incident on the laser irradiation surface of the semiconductor wafer 20. The laser annealing apparatus according to the present example performs, for example, activation annealing of a dopant doped in the semiconductor wafer 20. The semiconductor wafer 20 is, for example, a silicon wafer.

The control device 40 includes a console that is operated by a user. The user operates the console to input information designating the pulse repetition frequency of the pulsed laser beam. The control device 40 provides the driver 37 with the information designating the repetition frequency of the input pulse.

The control device 40 further controls the beam scanner 15 and the moving mechanism 17 to move the beam spot on the laser irradiation surface of the semiconductor wafer 20. An xyz orthogonal coordinate system is defined in which the direction in which the beam spot moves in the scanning with the pulsed laser beam by the beam scanner 15 is an x direction and the direction orthogonal to the x direction in the laser irradiation surface is a y direction. The movement of the beam spot in the x direction in the scanning with the pulsed laser beam by the beam scanner 15 is called "sweep". The control device 40 performs annealing of the semiconductor wafer 20 by sweeping the beam spot in the x direction by controlling the beam scanner 15 while moving the semiconductor wafer 20 in the y direction by controlling the moving mechanism 17.

The maximum length in which the beam spot can sweep in the x direction depends on the swing angle of the pulsed laser beam by the beam scanner 15 and the performance of the fθ lens 16. In a case where the maximum length of the sweep is shorter than the dimension of the semiconductor wafer 20, the processing of sweeping the beam spot in the x direction while moving the semiconductor wafer 20 in the y direction is repeated several times while moving the semiconductor wafer 20 in the x direction, so that almost the entire area of the semiconductor wafer 20 can be annealed.

Next, a temporal change in surface temperature when the pulsed laser beam is incident on the semiconductor wafer 20 will be described with reference to FIG. 3.

For the sake of simplicity, a case where a laser pulse with a uniform power density P is incident on the semiconductor wafer 20 will be described. A surface temperature T of the laser irradiation surface of the semiconductor wafer 20 can be expressed by the following expression.

[Expression 1]

$$T = 2P\sqrt{\frac{t}{\pi C \rho \lambda}} \quad (1)$$

Here, t is an elapsed time from the start of heating, C is the specific heat of the semiconductor wafer 20, ρ is the density of the semiconductor wafer 20, and λ is the thermal conductivity of the semiconductor wafer 20. For example, the unit of the surface temperature T is "K", the unit of the power density P is "W/cm$^2$", the unit of the elapsed time t is "second", and the unit of the specific heat C is "J/g·K", the unit of the density ρ is "g/cm$^3$", and the unit of the thermal conductivity A is "W/cm·K".

When the pulse width of the pulsed laser beam is denoted by to, the highest attainment temperature $T_a$ of the laser irradiation surface is expressed by the following expression.

[Expression 2]

$$T_a = 2P\sqrt{\frac{t_0}{\pi C \rho \lambda}} \quad (2)$$

When a target value of the highest attainment temperature $T_a$ of the laser irradiation surface is determined, the power density P and the pulse width to required to raise the temperature to the target value are determined.

Figure 3:
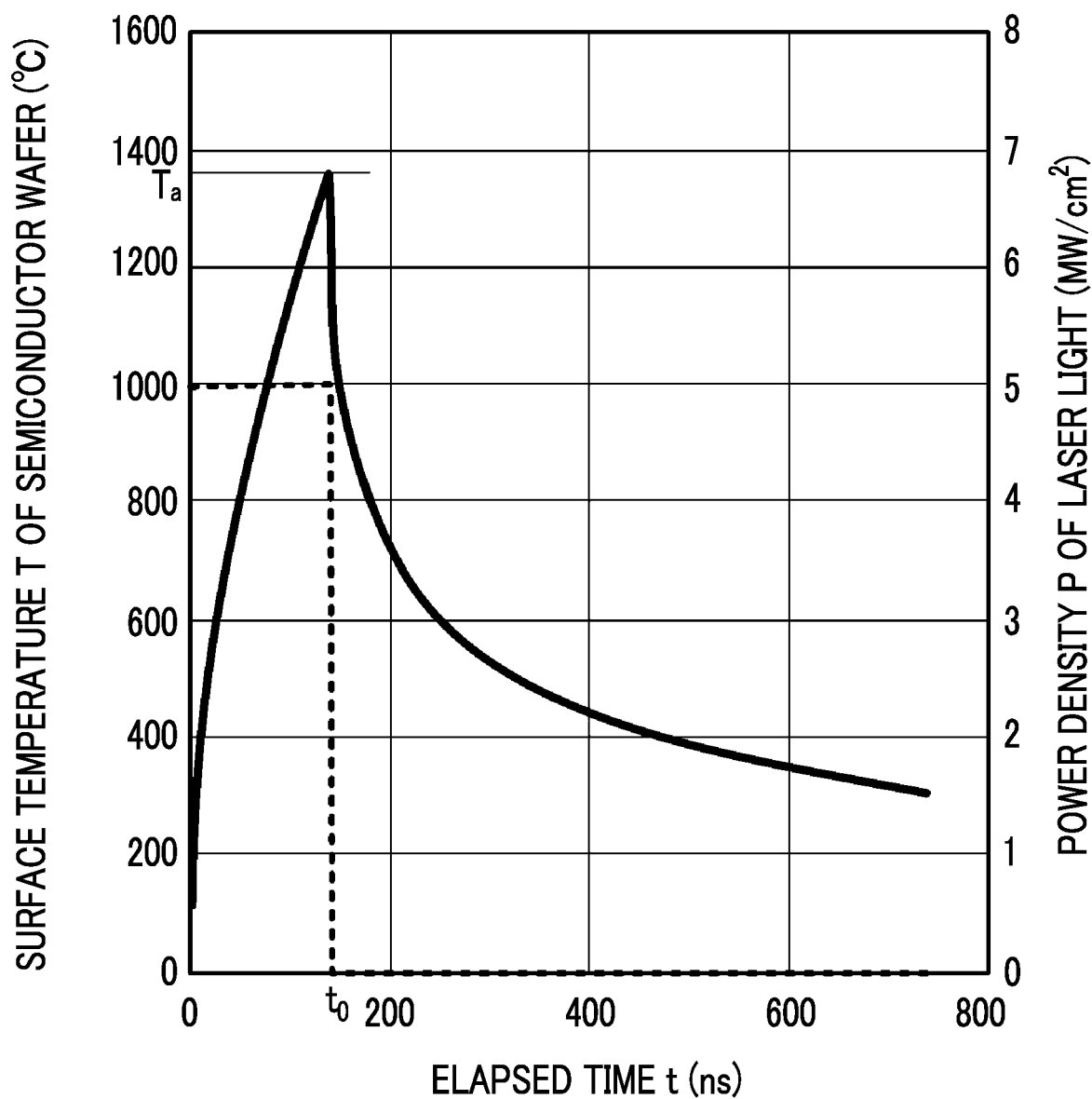
FIG. 3 is a graph showing calculated values in a temporal change of a surface temperature when one shot of a pulsed laser beam is incident on a silicon wafer.

FIG. 3 is a graph showing calculated values in a temporal change of the surface temperature T when one shot of the pulsed laser beam is incident on a silicon wafer. The horizontal axis represents the elapsed time t from the point in time of rising of the laser pulse in the unit of "ns", the left vertical axis represents the surface temperature T of the semiconductor wafer 20 in the unit of "° C.", and the right vertical axis represents the power density P of the pulsed laser beam in the unit of "MW/cm$^2$". A dashed line in the graph indicates a temporal change in the power density P of the pulsed laser beam, and a solid line indicates a temporal change in the surface temperature T of the semiconductor wafer 20. The pulse width of the pulsed laser beam is $t_0$ and the peak power density is 5 MW/cm$^2$.

During a period ($0 \leq t \leq t_0$) in which the laser pulse is incident, the surface temperature T rises according to Expression (1). The surface temperature T at the point in time ($t=t_0$) when the time corresponding to the pulse width $t_0$ has elapsed from the point in time of rising of the laser pulse is equal to the highest attainment temperature $T_a$. After the laser pulse falls ($t \geq t_0$), the surface temperature T is gradually lowered.

Next, a temperature rise of the non-irradiation surface of the semiconductor wafer 20 will be described with reference to FIGS. 4 to 5B.

Figure 4:
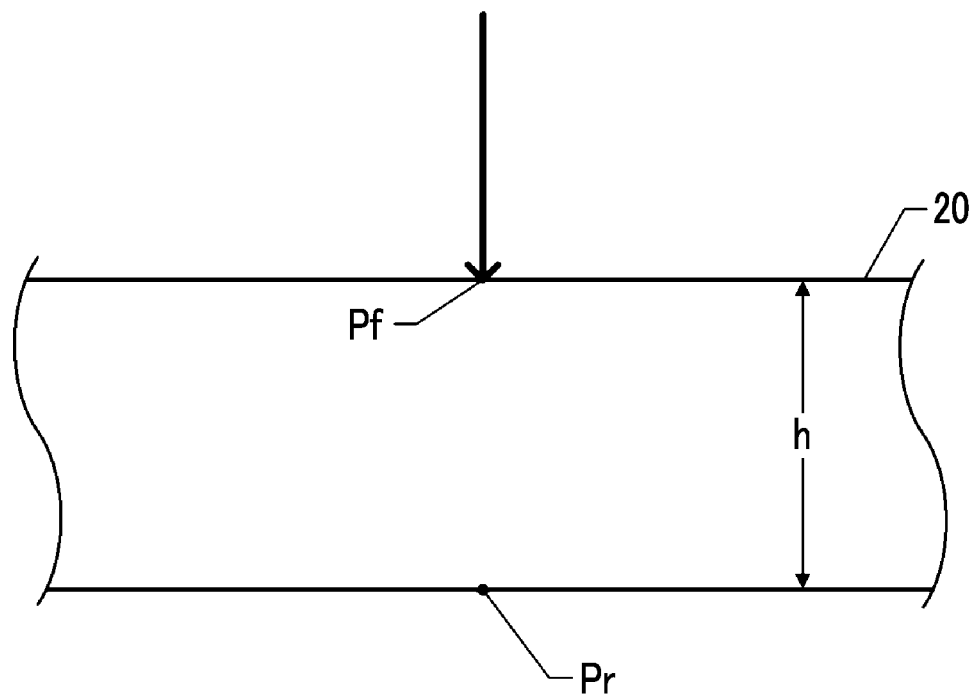
FIG. 4 is a sectional view of a semiconductor wafer on which the pulsed laser beam is incident.

FIG. 4 is a sectional view of the semiconductor wafer 20 on which the pulsed laser beam is incident. The incident position of the laser beam becomes a heat source Pf. For the sake of simplicity, when the temperature distribution of an infinitely thick plate immediately below the heat source is considered, a temperature rise amount ΔT at the position Pr on the non-irradiation surface immediately below the heat source Pf is expressed by the following expression.

[Expression 3]

$$\Delta T = \frac{Q}{2\pi \lambda h} e^{-\frac{vh}{2k}} \quad (3)$$

Here, Q is input heat from the heat source Pf to the semiconductor wafer 20, h is the thickness of the semiconductor wafer 20, v is a sweep speed of the heat source Pf, and k is the thermal diffusivity of the semiconductor wafer 20. For example, the unit of the input heat Q is "W", the unit of the thickness h of the semiconductor wafer 20 is "cm", the unit of the sweep speed v is "cm/s", and the unit of the thermal diffusivity k is "cm$^2$/s".

From Expression (3), it can be seen that the slower the sweep speed v of the heat source Pf, the greater the temperature rise amount ΔT at the point Pr on the non-irradiation surface becomes. In particular, in a case where the thickness h of the semiconductor wafer 20 is thin, the temperature rise amount ΔT increases significantly.

Figure 5A:
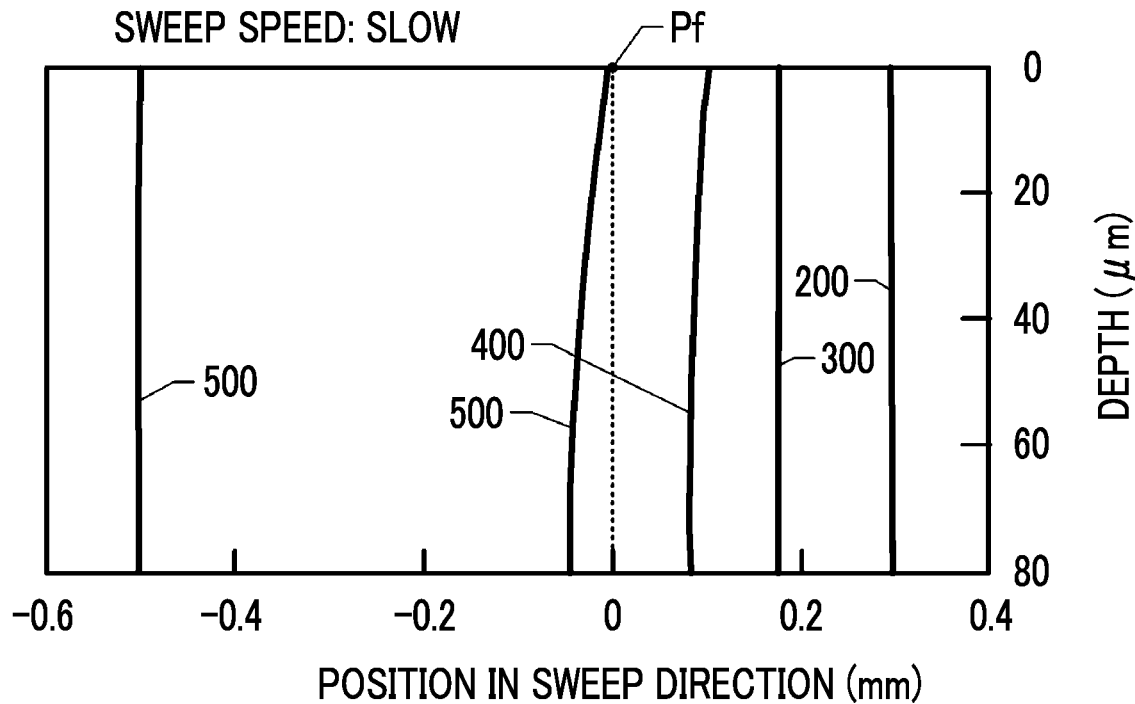
FIGS. 5A and 5B are graphs showing examples of the calculation results of the temperature distribution within the cross section of the semiconductor wafer.
Figure 5B:
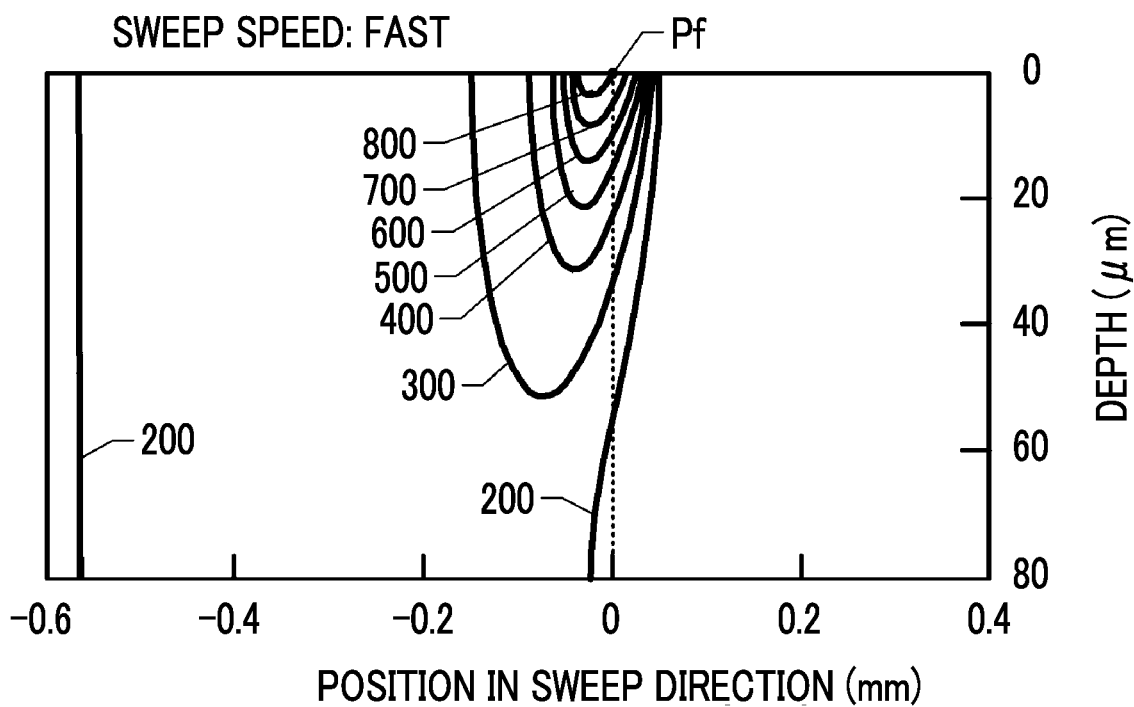

FIGS. 5A and 5B are graphs showing examples of the calculation results of the temperature distribution within the cross section of the semiconductor wafer 20. FIGS. 5A and 5B show the temperature distributions in the cross section of the wafer at a finite thickness and under an adiabatic condition of the non-irradiation surface. The horizontal axis represents the position of the heat source Pf in a sweep direction. The current position of the heat source Pf is set to be the origin of the horizontal axis, and a moving direction of the heat source is set to be positive. The vertical axis represents a depth from the laser irradiation surface in the unit of "µm". FIGS. 5A and 5B show the temperature distributions in a case where the sweep speeds v of the heat source Pf are different. FIG. 5B shows the temperature distribution in a case where the sweep speed v of the heat source Pf is faster than that in FIG. 5A. The curves in the graph represent isothermal lines, and the numerical value attached to each curve represents a temperature in the unit of "° C.".

It can be seen that in a case where the sweep speed v is slow (FIG. 5A), the temperature gradient in the thickness direction is gentler than that in a case where the sweep speed v is fast (FIG. 5B). That is, in a case where the sweep speed v is slow, the temperature rise amount ΔT of the non-irradiation surface is larger than that in a case where the sweep speed v is fast. In other words, the temperature rise amount ΔT of the non-irradiation surface can be reduced by increasing the sweep speed v.

Next, a laser annealing method according to the present example will be described with reference to FIG. 6.

FIG. 6 is a flowchart showing the procedure of the laser annealing method according to the present example. First, the laser power and the beam size on the laser irradiation surface are determined from a first target value of the highest attainment temperature of the laser irradiation surface of the semiconductor wafer 20 (step S1). The power density P can be determined from the laser power and the beam size. The first target value of the highest attainment temperature can be determined based on the melting point of the semiconductor wafer 20. For example, in a case where it is desired to melt the surface layer portion of the semiconductor wafer 20, it is favorable if the highest attainment temperature is set to be equal to or higher than the melting point. In a case where it is desired to perform annealing without melting, it is favorable if the highest attainment temperature is set to be lower than the melting point.

The pulse repetition frequency and the sweep speed v are determined under the condition that two consecutive shots of the beam spots partially overlap each other or are in contact with each other and under the condition that the highest attainment temperature of the non-irradiation surface is equal to or lower than a second target value (step S2). It is favorable if the second target value of the highest attainment temperature of the non-irradiation surface is set to, for example, a temperature in the extent that the protective tape attached to the non-irradiation surface is not damaged.

Next, a method for determining a pulse repetition frequency f and the sweep speed v will be described with reference to FIGS. 7A and 7B.

Figure 7A:
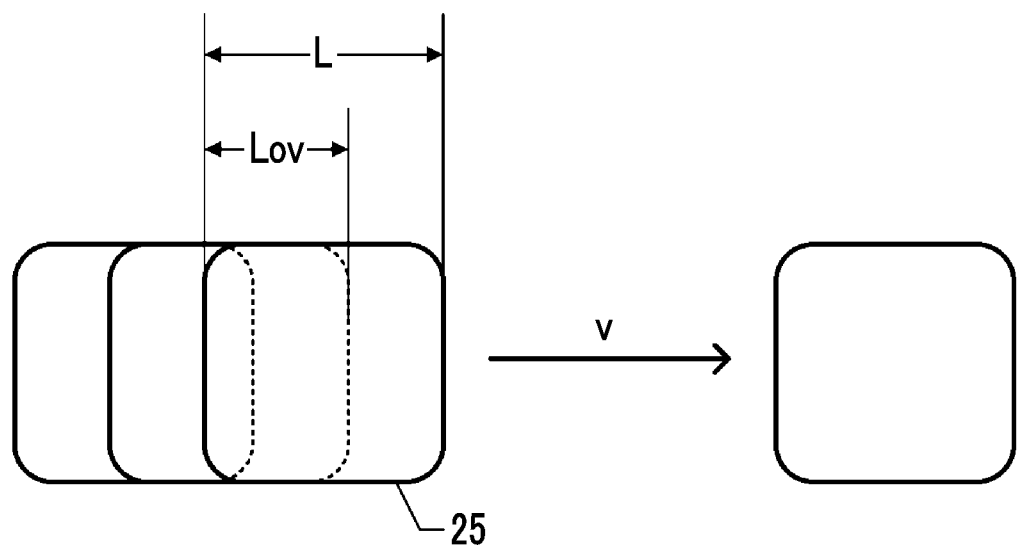
FIGS. 7A and 7B are schematic diagrams showing a movement history of a beam spot.
Figure 7B:
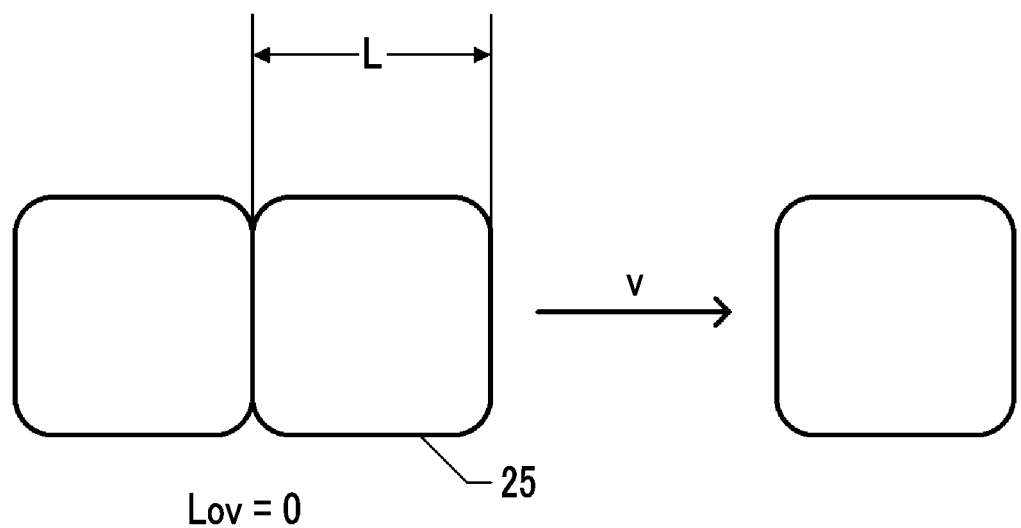

FIGS. 7A and 7B are schematic diagrams showing a movement history of a beam spot 25. FIG. 7A shows an example in which two consecutive shots of the beam spots 25 partially overlap each other, and FIG. 7B shows an example in which two consecutive shots of the beam spots 25 are in contact with each other. The dimension in the sweep direction of the beam spot is denoted by L, and the dimension in the sweep direction of the region where two consecutive shots of the beam spots overlap each other is denoted by Lov. The dimension Lov of the overlap region is represented by the following expression.

[Expression 4]

$$Lov = L - \frac{v}{f} \quad (4)$$

In order for two consecutive shots of the beam spots not to be separated from each other, it is favorable if the relationship of Lov≥0 is satisfied. That is, it is favorable that the sweep speed v is determined such that the following Expression (5) is satisfied.

[Expression 5]

$$v \leq f \times L \quad (5)$$

Laser annealing is performed at the laser power and beam size determined in step S1 shown in FIG. 6, and the pulse repetition frequency and the sweep speed of the beam spot determined in step S2 (step S3).

Next, the excellent effects of the above example will be described.

From Expression (3), it can be seen that when the sweep speed v of the beam spot is faster than 2 k/h, the temperature rise amount ΔT of the non-irradiation surface is reduced to 1/e (about 0.37 times) of the temperature rise amount ΔT in a case where the laser irradiation is performed with the sweep speed v set to 0. In order to obtain a significant effect of reducing the temperature rise amount ΔT of the non-irradiation surface of the semiconductor wafer 20, it is preferable to make the sweep speed v faster than 2 k/h. In other words, it is preferable to make the beam spot sweep speed of the laser beam faster than twice the value obtained by dividing the thermal diffusivity of the semiconductor wafer 20 by the thickness of the semiconductor wafer 20.

In the above example, the sweeping of the beam spot 25 is performed by performing scanning with the pulsed laser beam by the beam scanner 15. Therefore, by moving the semiconductor wafer 20 by operating the moving mechanism 17, it is possible to make the sweep speed v faster compared to a case of sweeping the beam spot on the laser irradiation surface.

Next, modification examples of the above example will be described. In order to reduce the temperature rise amount ΔT of the non-irradiation surface, it is preferable to make the sweep speed v fast as much as possible, as can be seen from Expression (3). However, from Expression (5), the upper limit value of the sweep speed v is limited by the product of the pulse repetition frequency f of the pulsed laser beam and the beam size L. In order to increase the upper limit value of the sweep speed v, it is desirable to increase the pulse repetition frequency f and increase the beam size L.

If the beam size L is increased under the condition that the laser power is kept constant, the power density P on the laser irradiation surface of the semiconductor wafer 20 is reduced. In order to maintain the highest attainment temperature $T_a$ of the laser irradiation surface under the condition that the power density P is lowered, the pulse width to has to be increased. If the pulse width to is increased, the amount of heat transferred in the thickness direction during the period in which the laser pulse is incident is increased. As a result, the temperature of the non-irradiation surface increases. Therefore, the beam size L cannot be unconditionally increased.

In order to increase the upper limit value of the sweep speed v without increasing the beam size L, from Expression (5), it can be seen that it is favorable if the pulse repetition frequency f is increased. For example, in order to suppress an excessive rise in the temperature of the non-irradiation surface of the semiconductor wafer having a thickness of 100 μm or less, the pulse repetition frequency f is preferably 15 kHz or more, and more preferably 100 kHz or more.

In a case where the pulse repetition frequency f is low, the influence of the temperature rise of the laser irradiation surface due to the immediately preceding shot is eliminated, and after the temperature has decreased to the original temperature, the next shot is incident on the semiconductor wafer 20. If the pulse repetition frequency f is increased, the next shot is performed in a state where the thermal effect due to the immediately preceding shot remains. In particular, if the pulse repetition frequency f is set to 15 kHz or more, the next shot is incident in a state where a temperature rise of 1% or more of the temperature rise amount ΔT of the laser irradiation surface due to the immediately preceding shot remains. Further, if the pulse repetition frequency f is set to 100 kHz or more, the next shot is incident in a state where a temperature rise of 5% or more of the temperature rise amount ΔT of the laser irradiation surface due to the immediately preceding shot remains. Therefore, the laser irradiation surface can be heated more efficiently.

In the above example, the fiber laser is used as the laser light source 10 (FIGS. 1 and 2). However, in addition, a mode-locked laser or the like may be used. Further, in the above example, the pulsed laser is used for laser annealing. However, a continuous wave (CW) laser may be used. The CW laser corresponds to a case where the pulse repetition frequency f of the pulsed laser is set to an infinity.

Further, in the above example, the galvanometer scanner is used for sweeping of the beam spot at the sweep speed v. However, in a case where the semiconductor wafer 20 can be moved at a sufficient speed by using the XY stage or the like, the beam spot may sweep on the laser irradiation surface of the semiconductor wafer 20 by fixing the path of the laser beam and moving the semiconductor wafer 20.

The above example is exemplification, and the present invention is not limited to the above example. For example, it will be obvious to those skilled in the art that various changes, improvements, combinations, and the like are possible.

It should be understood that the invention is not limited to the above-described embodiment, but may be modified into various forms on the basis of the spirit of the invention. Additionally, the modifications are included in the scope of the invention.

What is claimed is:

1. A control device for controlling an annealing apparatus that performs laser annealing by causing a laser beam to be incident on a surface of a semiconductor wafer and moving a beam spot of the laser beam on the surface of the semiconductor wafer,
    wherein the control device makes a sweep speed of the beam spot of the laser beam faster than twice a value obtained by dividing a thermal diffusivity of the semiconductor wafer by a thickness of the semiconductor wafer.

2. The control device according to claim 1, wherein the annealing apparatus includes
    a moving mechanism that holds the semiconductor wafer and moves the semiconductor wafer in a first direction, and
    a beam scanner that performs scanning with the laser beam to move the beam spot on the surface of the semiconductor wafer in a second direction intersecting the first direction, and
    the sweep speed in the second direction of the beam spot with respect to the semiconductor wafer is set to be faster than twice a value obtained by dividing a thermal diffusivity of the semiconductor wafer by a thickness of the semiconductor wafer.

3. The control device according to claim 2, wherein the laser beam is a pulsed laser beam, a pulse repetition frequency is 15 kHz or more, and under a condition that two consecutive shots of beam spots partially overlap each other or are in contact with each other, the beam spots are moved in the second direction.

4. The control device according to claim 3, wherein the pulse repetition frequency of the laser beam is 100 kHz or more.

5. A laser annealing method comprising:
- determining laser power of a pulsed laser beam that is incident on a laser irradiation surface of a semiconductor wafer and a beam size of the pulsed laser beam on the laser irradiation surface of the semiconductor wafer, from a first target value of a highest attainment temperature of the laser irradiation surface of the semiconductor wafer;
- determining a pulse repetition frequency and a sweep speed under a condition that two consecutive shots of beam spots partially overlap each other or are in contact with each other when sweeping a beam spot of the pulsed laser beam on the laser irradiation surface of the semiconductor wafer;
- determining the sweep speed under a condition that a highest attainment temperature of a back surface on a side opposite to the laser irradiation surface of the semiconductor wafer does not exceed a second target value, when determining the sweep speed; and
- performing laser annealing of the semiconductor wafer at the determined laser power, beam size, pulse repetition frequency, and sweep speed of the beam spot.

* * * * *